(12) United States Patent
Lee et al.

(10) Patent No.: US 12,745,539 B2
(45) Date of Patent: Sep. 22, 2026

(54) ENCAPSULATING COMPOSITION AND ORGANIC ELECTRONIC DEVICE COMPRISING SAME

(71) Applicant: LG CHEM, LTD., Seoul (KR)

(72) Inventors: Tae Seob Lee, Daejeon (KR); Yoon Bin Lim, Daejeon (KR); Ha Neul Kim, Daejeon (KR); Jeong Gon Kim, Daejeon (KR); Kwan Jegal, Daejeon (KR); I Seul Lim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 455 days.

(21) Appl. No.: 18/259,705

(22) PCT Filed: Dec. 31, 2021

(86) PCT No.: PCT/KR2021/020342

§ 371 (c)(1),
(2) Date: Jun. 28, 2023

(87) PCT Pub. No.: WO2022/146099

PCT Pub. Date: Jul. 7, 2022

(65) Prior Publication Data

US 2024/0317914 A1 Sep. 26, 2024

(30) Foreign Application Priority Data

Dec. 31, 2020 (KR) ........................ 10-2020-0189178

(51) Int. Cl.
*H10K 59/80* (2023.01)
*C08F 220/18* (2006.01)
(Continued)

(52) U.S. Cl.
CPC ........ *H10K 59/87* (2023.02); *C08F 220/1811* (2020.02); *H10K 50/00* (2023.02); *H10K 50/844* (2023.02); *H10K 71/10* (2023.02)

(58) Field of Classification Search
CPC ...... H10K 59/87; H10K 50/00; H10K 50/844; H10K 71/10; H10K 50/8445;
(Continued)

(56) References Cited

U.S. PATENT DOCUMENTS

2017/0044405 A1 2/2017 Yoo et al.
2019/0211219 A1 7/2019 Kondo et al.
(Continued)

FOREIGN PATENT DOCUMENTS

JP 2014-196387 A 10/2014
JP 2020-057580 A 4/2020
(Continued)

OTHER PUBLICATIONS

International Search Report and Written Opinion issued for International Application No. PCT/KR2021/020342 on Apr. 12, 2022, 11 pages.

*Primary Examiner* — Blaine Copenheaver
(74) *Attorney, Agent, or Firm* — ROTHWELL, FIGG, ERNST & MANBECK, P.C.

(57) ABSTRACT

The encapsulating composition according to the present invention comprises a radical-curable compound having at least one or more radical-curable functional groups, and has composition polarizability of 1.8 or less, wherein the composition polarizability is the sum of values obtained by
(Continued)

multiplying each "compound polarizability of radical-curable compounds" constituting the encapsulating composition and "the weight ratio of the relevant radical-curable compound to the encapsulating composition" and the compound polarizability may be calculated by the following general equation 1.

Compound polarizability=(the value obtained by combining the number of carbons and the number of oxygens included in the molecular structure of the relevant radical-curable compound)/(the value obtained by subtracting the number of oxygens from the number of carbons in the molecular structure of the relevant radical-curable compound) [General Equation 1]

12 Claims, 1 Drawing Sheet

(51) Int. Cl.
*H10K 50/00* (2023.01)
*H10K 50/844* (2023.01)
*H10K 71/10* (2023.01)

(58) Field of Classification Search
CPC .... C08F 220/1811; C08F 2/48; C08F 220/18; C08F 222/10; C08F 2/50; C08F 220/1818; C08F 222/102; C08F 222/103; G06F 3/041; C09D 11/101
See application file for complete search history.

(56) References Cited

U.S. PATENT DOCUMENTS

| | | | | |
|---|---|---|---|---|
| 2021/0234111 | A1* | 7/2021 | Kwak | C09K 3/10 |
| 2022/0002569 | A1 | 1/2022 | Choi et al. | |
| 2022/0017693 | A1* | 1/2022 | Yu | C09D 171/02 |
| 2025/0259903 | A1* | 8/2025 | Jang | C08K 3/22 |

FOREIGN PATENT DOCUMENTS

| | | | |
|---|---|---|---|
| KR | 10-1742425 | B1 | 5/2017 |
| KR | 10-2020-0054900 | A | 5/2020 |
| TW | 202030211 | A | 8/2020 |
| WO | 2006-107802 | A1 | 10/2006 |
| WO | 2020066602 | A1 | 4/2020 |

* cited by examiner

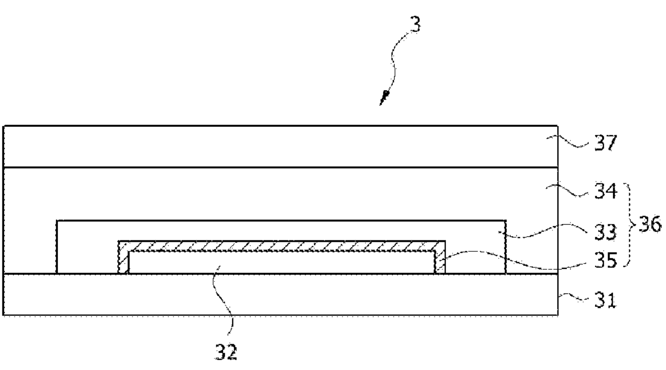
3
37
34
33
35
36
31
32

ENCAPSULATING COMPOSITION AND ORGANIC ELECTRONIC DEVICE COMPRISING SAME

CROSS REFERENCE TO RELATED APPLICATION

This application is a 35 U.S.C. 371 National Phase Entry application from PCT/KR2021/020342, filed Dec. 31, 2021, which claims the benefit of Korean Patent Application No. 10-2020-0189178 filed on Dec. 31, 2020, the disclosures of which are incorporated herein in their entirety by reference.

TECHNICAL FIELD

The present invention relates to an encapsulating composition and an organic electronic device comprising the same.

BACKGROUND

A touch sensor refers to a type of input device that is installed in an image display device such as a liquid crystal display device, a field emission display device (FED), a plasma display panel (PDP), an electroluminescence display device (EL) or an electrophoretic display device, where a user pressurizes (presses or touches) a touch panel while looking at the image display device to input predetermined information.

Recently, in accordance with the trend of enlargement and thinning of the display device, it is a fact that the structural form factor of the touch sensor used in the above-described display device changes. Accordingly, a display device in which a touch sensor is directly formed on a sealing layer is developed.

Meanwhile, in accordance with the thinning of the display device as such, a gap between electrodes for the touch sensor constituting the touch sensor and upper electrodes in the image display device becomes narrower, so that there may be a problem that the touch sensitivity of the touch sensor is lowered by generating a parasitic current.

Therefore, it is a main solving task that the dielectric constant of the sealing layer is lowered to increase the user's touch sensitivity.

BRIEF SUMMARY

Technical Problem

It is a problem to be solved by the present invention to provide an encapsulating composition capable of implementing excellent touch sensitivity based on the low dielectric constant properties. The technical problems of the present invention are not limited to the technical problems mentioned above, and other technical problems not mentioned will be clearly understood by those skilled in the art from the following description.

Technical Solution

The present invention can be subjected to various modifications and can have various examples, where specific examples will be illustrated in the drawings and described in detail. However, this is not intended to limit the present invention to specific embodiments, and it should be understood to include all modifications, equivalents and substitutes included in the spirit and scope of the present invention.

DETAILED DESCRIPTION

When an element such as a layer, a region or a substrate is referred to as being present "on" another component, it will be possible to appreciate that it can be present directly on another element or an intermediate element can also be present therebetween.

The terms used in the present application are only used to describe specific examples, which are not intended to limit the present invention. A singular expression includes a plural expression, unless the context clearly dictates otherwise. In the present application, it should be understood that the term such as "comprise" or "have" is intended to designate that a feature, number, step, operation, component, part, or combination thereof described in the specification exists, but it does not preclude one or more other features, or existence or addition possibility of numbers, steps, operations, components, parts or combinations thereof in advance.

Unless otherwise defined, all terms used herein, including technical or scientific terms, have the same meanings as those commonly understood by those having ordinary knowledge in the art to which the present invention belongs. Terms such as those defined in commonly used dictionaries should be interpreted as having meanings consistent with the meanings in the context of the related art, which are not interpreted in ideal or excessively formal meanings, unless explicitly defined in the present application.

<Encapsulating Composition>

The present application relates to an encapsulating composition for an organic electronic element. The encapsulating composition may be, for example, a sealing material applied to sealing or encapsulating an organic electronic device such as an OLED. In one example, the encapsulating composition of the present application may be applied to sealing or encapsulating the top surface of the organic electronic element. Accordingly, after the encapsulating composition is applied to encapsulation, it may exist in a form of sealing the top surface of the organic electronic device.

In this specification, the term "organic electronic device" means an article or device having a structure comprising an organic material layer that generates alternate currents of electric charges between a pair of electrodes facing each other by using holes and electrons, where an example thereof may include a photovoltaic device, a rectifier, a transmitter and an organic light emitting diode (OLED), and the like, but is not limited thereto. In one example of the present application, the organic electronic device may be an OLED.

As the present application provides on a top emission type organic electronic element an encapsulating composition that is applied to be in direct contact with the element, it should have excellent optical properties after curing, and should prevent deterioration of the element due to outgas generated during curing of the composition. In particular, the encapsulating composition of the present application should implement excellent discharge properties, spreadability and low viscosity for application to an inkjet process, and implement high surface hardness after curing, thereby preventing damage caused by an inorganic layer forming process in a sealing layer, and it should be possible to realize excellent touch sensitivity in a thin-film organic electronic device based on low dielectric constant characteristics. Accordingly, the present application can provide a composition for encapsulating an organic electronic element capable of simultaneously implementing not only the optical properties, element reliability, low viscosity properties and high hardness but also low dielectric constants by using a specific composition as described below.

In the present application, the encapsulating composition may comprise a radical-curable compound. The radical-curable compound means a composition that can be cured by radical polymerization according to light irradiation, which may have at least one or more radical-curable functional groups. Here, the irradiated light may be made by, for example, irradiation of particle beams such as alpha-particle beams, proton beams, neutron beams and electron beams, as well as electromagnetic waves such as microwaves, infrared rays (IR), ultraviolet rays (UV), X-rays or gamma rays. As one example, the radical-curable functional group is not limited unless otherwise specified, but as one example, the (meth)acrylic group may be an acryl group or a methacryl group, and more specifically, the polyfunctional aliphatic compound may be a polyfunctional aliphatic (meth)acrylic compound: the monofunctional alicyclic compound may be a monofunctional alicyclic (meth)acrylic compound: the polyfunctional alicyclic compound may be a polyfunctional alicyclic (meth)acrylic compound; and the monofunctional aliphatic compound may be a monofunctional aliphatic (meth)acrylic compound.

In one embodiment, the encapsulating composition of the present application may comprise a radical-curable compound having at least one or more radical-curable functional groups, and may have composition polarizability of 1.8 or less, 1.79 or less, 1.78 or less, 1.77 or less, 1.76 or less, 1.75 or less, 1.74 or less, 1.73 or less, 1.72 or less, 1.71 or less, 1.7 or less, 1.69 or less, 1.68 or less, 1.67 or less, 1.66 or less, 1.65 or less, 1.64 or less, 1.63 or less, 1.62 or less, 1.61 or less, 1.6 or less, 1.59 or less, 1.58 or less, 1.57 or less, 1.56 or less, 1.55 or less, 1.54 or less, 1.53 or less, 1.52 or less, 1.51 or less, 1.5 or less, 1.49 or less, 1.48 or less, 1.47 or less, 1.46 or less, 1.45 or less, 1.44 or less, 1.43 or less, 1.42 or less, 1.41 or less, 1.4 or less, 1.39 or less, 1.38 or less, 1.37 or less, or 1.36 or less. In addition, the lower limit of the composition polarizability may be 1 or more.

Here, the composition polarizability is the sum of values obtained by multiplying each "compound polarizability of radical-curable compounds" constituting the encapsulating composition and "parts by weight of the relevant radical-curable compound relative to 100 parts by weight of the encapsulating composition (that is, the weight ratio of the relevant radical-curable compound to the encapsulating composition)", where the compound polarizability may be calculated by the following general equation 1.

Compound polarizability=(the value obtained by combining the number of carbons and the number of oxygens included in the molecular structure of the relevant radical-curable compound)/(the value obtained by subtracting the number of oxygens from the number of carbons included in the molecular structure of the relevant radical-curable compound) [General Equation 1]

In General Equation 1, the number of carbons (or hydrogens) included in the molecular structure of the radical-curable compound refers to the sum of all carbon (or hydrogen) numbers constituting the structural formula of the radical-curable compound. As one example, when the encapsulating composition is composed of a radical-curable compound (X), a radical-curable compound (Y) and a radical-curable compound (Z), the composition polarizability may be calculated by (polarizability of compound X*weight ratio of compound X to the encapsulating composition)+(polarizability of compound Y*weight ratio of compound Y to the encapsulating composition)+(polarizability of compound Z*weight ratio of compound Z to the encapsulating composition). Here, when calculating the weight ratio of the radical-curable compound, it is calculated based on the total weight of all compositions included in the encapsulating composition, and it is calculated by including not only the radical-curable compound but also the photoinitiator or surfactant, and the like together.

That is, the present application can provide the composition desired by the present application by controlling the composition polarizability of the radical-curable compounds constituting the composition.

In one example, the radical-curable compound may comprise an alicyclic compound (X). Here, the alicyclic compound is a monomer having at least one or more cyclic structures in the molecular structure as an alicyclic hydrocarbon series, which may be one comprising no aromatic group such as a benzene ring. As one example, the alicyclic compound (X) may comprise a bicyclic or tricyclic compound. The bicyclic or tricyclic compound means that as rings in which two or three rings are each bonded in the molecular structure, the respective rings share at least one or more common atoms or common bonds, unlike rings connected through covalent bonds between atoms belonging to different rings. More specifically, the bicyclic or tricyclic compound may be a spiro compound, a fused-ring compound or a bridged-ring compound, and as one example, the bicyclic or tricyclic compound may be a carbobicycle compound. The carbobicycle compound means a compound in which all atoms constituting two bonded rings are carbon atoms. As such, the composition according to the present application comprises the alicyclic compound (X) having a bulky structure, thereby increasing the molar volume of the composition and preventing polarization phenomena through steric hindrance and the like, and thus the low dielectric constant properties of the composition can be implemented.

In one example, the alicyclic compound (X) may be included in an amount of 10 to 100 wt % based on the encapsulating composition, and more specifically, it may be included in an amount of 13 wt % or more, 15 wt % or more, 17 wt % or more, 20 wt % or more, 23 wt % or more, 25 wt % or more, 27 wt % or more, 30 wt % or more, 33 wt % or more, 35 wt % or more, 37 wt % or more, 40 wt % or more, 43 wt % or more, 45 wt % or more, 47 wt % or more, 50 wt % or more, 53 wt % or more, 55 wt % or more, 57 wt % or more, 60 wt % or more, 63 wt % or more, 65 wt % or more, 68 wt % or more, 70 wt % or more, 73 wt % or more, or 75 wt % or more, where it may be 97 wt % or less, 95 wt % or less, 93 wt % or less, 90 wt % or less, 87 wt % or less, 85 wt % or less, 83 wt % or less, 80 wt % or less, 77 wt % or less, 75 wt % or less, 73 wt % or less, 70 wt % or less, 67 wt % or less, 65 wt % or less, 63 wt % or less, 60 wt % or less, 55 wt % or less, 50 wt % or less, 45 wt % or less, or 40 wt % or less. By adjusting the composition to have a low dielectric constant through the composition of the encapsulating composition, the present application can effectively prevent interference between circuits. In general, various methods can be adopted in the same industry to lower the dielectric constant, but this is separate from the realization of inkjetting properties. According to the present application, it is possible to provide an encapsulating composition satisfying excellent curing sensitivity after curing while maintaining the inkjetting properties, and simultaneously capable of implementing low dielectric constants and moisture barrier properties.

In one example, the alicyclic compound (X) may comprise a monofunctional alicyclic compound (X1). Here, the monofunctional alicyclic compound (X1) means one which is an alicyclic compound, but has one functional group in the molecule, and as one example, the monofunctional alicyclic compound (X1) is not limited thereto, but may include isobornyl (meth)acrylate, 1,3-adamantanediol (meth)acrylate, 2-methyl-2-adamantyl (meth)acrylate, 2-ethyl-2-adamantyl (meth)acrylate, 1-adamantyl (meth)acrylate, and the like. Also, it may include a compound of Formula 1 below, and as one example, the compound of Formula 1 may be 2-isopropyl-5-methylcyclohexyl (meth)acrylate.

[Formula 1]

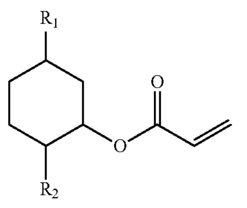

In Formula 1, $R_1$ and $R_2$ may be each independently a linear or branched alkyl group with 1 to 6 carbon atoms. As one example, $R_1$ and $R_2$ are not limited thereto, but may be a methyl group, an isopropyl group or a t-butyl group. In particular, when the alkyl group has a branched structure, the dipole moment may be lowered, so that the aliphatic compound (Y) having a branched alkyl group may be more preferable.

Also, in one example, the monofunctional alicyclic compound (X1) may be included in an amount of 10 to 60 wt % based on the encapsulating composition, and more specifically, it may be included in an amount of 12 wt % or more, 14 wt % or more, 16 wt % or more, 18 wt % or more, 20 wt % or more, 22 wt % or more, 30 wt % or more, 35 wt % or more, or 40 wt % or more, and it may be 58 wt % or less, 56 wt % or less, 54 wt % or less, 52 wt % or less, 50 wt % or less, 48 wt % or less, 46 wt % or less, 44 wt % or less, 42 wt % or less, 30 wt % or less, or 25 wt % or less.

Furthermore, in one example, the alicyclic compound (X) may comprise a polyfunctional alicyclic compound (X2). Here, the polyfunctional alicyclic compound (X2) means as an alicyclic compound one containing two or more functional groups in the molecule, and as one example, the polyfunctional alicyclic compound (X2) may be exemplified by tricyclodecane dimethanol diacrylate or tricyclodecane dimethanol di(meth)acrylate, and the like, but is not limited thereto.

In one example, the polyfunctional alicyclic compound (X2) may be included in an amount of 20 to 120 parts by weight relative to 100 parts by weight of the monofunctional alicyclic compound (X1). Specifically, the lower limit of the polyfunctional alicyclic compound (X2) may be 23 parts by weight or more, 25 parts by weight or more, 27 parts by weight or more, 30 parts by weight or more, 33 parts by weight or more, 35 parts by weight or more, 37 parts by weight or more, 40 parts by weight or more, 50 parts by weight or more, 60 parts by weight or more, 70 parts by weight or more, 75 parts by weight or more, 80 parts by weight or more, or 90 parts by weight or more, relative to 100 parts by weight of the monofunctional alicyclic compound (X1), and the upper limit thereof may be 110 parts by weight or less, 105 parts by weight or less, 100 parts by weight or less, 95 parts by weight or less, 93 parts by weight or less, 91 parts by weight or less, 90 parts by weight or less, 80 parts by weight or less, 70 parts by weight or less, 60 parts by weight or less, 50 parts by weight or less, or 45 parts by weight or less.

In one embodiment, the radical-curable compound may comprise an aliphatic compound (Y) having a linear or branched alkyl group. Here, the aliphatic compound (Y) having a linear or branched alkyl group means as an aliphatic hydrocarbon series a monomer having a linear or branched alkyl group in the molecular structure, which may be distinguished from the alicyclic compound (X) in that there is no cyclic structure in the molecular structure and may be one without any aromatic group. In particular, when the alkyl group in the aliphatic compound (Y) has a branched structure, the dipole moment may be lowered, so that the aliphatic compound (Y) having a branched alkyl group may be more preferable.

In one example, the aliphatic compound (Y) having a linear or branched alkyl group may be included in an amount of 30 to 300 parts by weight relative to 100 parts by weight of the monofunctional alicyclic compound (X1). Specifically, relative to 100 parts by weight of the monofunctional alicyclic compound (X1), the lower limit of the aliphatic compound (Y) having a linear or branched alkyl group may be 35 parts by weight or more, 40 parts by weight or more, 45 parts by weight or more, 50 parts by weight or more, 55 parts by weight or more, 60 parts by weight or more, 61 parts by weight or more, 62 parts by weight or more, 70 parts by weight or more, 80 parts by weight or more, 100 parts by weight or more, 200 parts by weight or more, or 250 parts by weight or more, and the upper limit thereof may be 280 parts by weight or less, 270 parts by weight or less, 260 parts by weight or less, 200 parts by weight or less, 150 parts by weight or less, 100 parts by weight or less, 90 parts by weight or less, 80 parts by weight or less, 70 parts by weight or less, 60 parts by weight or less, or 50 parts by weight or less.

Also, in one example, the aliphatic compound (Y) having a linear or branched alkyl group may be included in an amount of 5 to 250 parts by weight relative to 100 parts by weight of the alicyclic compound (X). Specifically, relative to 100 parts by weight of the alicyclic compound (X), the lower limit of the aliphatic compound (Y) having a linear or branched alkyl group may be 15 parts by weight or more, 25 parts by weight or more, 35 parts by weight or more, 45 parts by weight or more, 55 parts by weight or more, 60 parts by weight or more, 80 parts by weight or more, 100 parts by weight or more, 120 parts by weight or more, or 140 parts by weight or more, and the upper limit thereof may be 200 parts by weight or less, 150 parts by weight or less, 100 parts by weight or less, 70 parts by weight or less, 50 parts by weight or less, or 30 parts by weight or less.

Furthermore, in one embodiment, the aliphatic compound (Y) having a linear or branched alkyl group may comprise a monofunctional aliphatic compound (Y1), where the monofunctional aliphatic compound (Y1) means as an aliphatic compound one having one functional group in the molecule.

Furthermore, in one example, the monofunctional aliphatic compound (Y1) may comprise an aliphatic compound having an alkyl group with 12 to 24 carbon atoms. For example, it may be n-dodecyl (meth)acrylate, isododecyl (meth)acrylate, n-tridecyl (meth)acrylate, isotridecyl (meth) acrylate, n-pentadecyl (meth)acrylate, isopentadecyl (meth) acrylate, n-hexadecyl (meth)acrylate, isohexadecyl (meth) acrylate, n-heptadecyl (meth)acrylate, isoheptadecyl (meth) acrylate, stearyl (meth)acrylate, isooctadecyl (meth) acrylate, n-nonadecyl (meth)acrylate, isononadecyl (meth)

acrylate, and the like, which is not limited thereto. As such, by introducing an aliphatic compound having a long-chain skeleton, the polarity of the entire molecule can be reduced, thereby realizing low dielectric constants of the composition.

In one example, the monofunctional aliphatic compound (Y1) may be included in an amount of 20 to 120 parts by weight relative to 100 parts by weight of the monofunctional alicyclic compound (X1). Specifically, the lower limit of the monofunctional aliphatic compound (Y1) may be 25 parts by weight or more, 30 parts by weight or more, 35 parts by weight or more, 40 parts by weight or more, 45 parts by weight or more, 47 parts by weight or more, 50 parts by weight or more, 60 parts by weight or more, 70 parts by weight or more, 80 parts by weight or more, or 90 parts by weight or more, relative to 100 parts by weight of the monofunctional alicyclic compound (X1), and the upper limit thereof may be 110 parts by weight or less, 107 parts by weight or less, 105 parts by weight or less, 103 parts by weight or less, 100 parts by weight or less, 97 parts by weight or less, 95 parts by weight or less, 93 parts by weight or less, 91 parts by weight or less, 80 parts by weight or less, 70 parts by weight or less, 60 parts by weight or less, or 50 parts by weight or less.

In one embodiment, the aliphatic compound (Y) having a linear or branched alkyl group may comprise a polyfunctional aliphatic compound (Y2). Here, the polyfunctional aliphatic compound (Y2) means as an aliphatic compound one having at least two or more functional groups in the molecule.

Also, in one example, the polyfunctional aliphatic compound (Y2) may comprise an aliphatic compound with bifunctionality to octa-functionality, and as one example, it may include hexanediol di(meth)acrylate, tripropylene glycol di(meth)acrylate, ethylene glycol di(meth)acrylate, trimethylolpropane tri(meth)acrylate, trimethylolpropaneethoxy tri(meth)acrylate, glycerin propoxylated tri(meth)acrylate, pentaerythritol tetra(meth)acrylate, dipentaerythritol hexa (meth)acrylate, tripentaerythritol hexa(meth)acrylate, tripentaerythritol hepta(meth)acrylate, 1,12-dodecanediol di(meth)acrylate, and the like, and may include two or more thereof, but is not limited thereto.

In one example, the polyfunctional aliphatic compound (Y2) may be included in an amount of 20 to 200 parts by weight relative to 100 parts by weight of the monofunctional alicyclic compound (X1). Specifically, the lower limit of the polyfunctional aliphatic compound (Y2) may be 23 parts by weight or more, 25 parts by weight or more, 27 parts by weight or more, 30 parts by weight or more, 33 parts by weight or more, 35 parts by weight or more, 37 parts by weight or more, 40 parts by weight or more, 80 parts by weight or more, 100 parts by weight or more, 130 parts by weight or more, or 160 parts by weight or more, relative to 100 parts by weight of the monofunctional alicyclic compound (X1), and the upper limit thereof may be 195 parts by weight or less, 193 parts by weight or less, 190 parts by weight or less, 187 parts by weight or less, 185 parts by weight or less, 183 parts by weight or less, 180 parts by weight or less, 178 parts by weight or less, 175 parts by weight or less, 173 parts by weight or less, 170 parts by weight or less, 168 parts by weight or less, 100 parts by weight or less, 80 parts by weight or less, or 50 parts by weight or less.

As described above, in the present application, the encapsulating composition may be applied to an organic electronic element by an inkjet method through the specific composition formulation, and the applied encapsulating composition may provide an organic layer having excellent curing sensitivity after curing. When the curing sensitivity is insufficient, uncured portions are generated or outgas is generated in the composition, which may cause serious endurance reliability problems due to the characteristics of the encapsulating composition of the present application applied directly on an organic electronic element. In addition, the encapsulating composition may implement low dielectric constant characteristics.

In this specification, the term “monomer” may refer to a compound having a weight average molecular weight in a range of 150 to 1,000 g/mol, 173 to 980 g/mol, 188 to 860 g/mol, 210 to 823 g/mol, or 330 to 780 g/mol. By adjusting the weight average molecular weights of the monomers included in the encapsulating composition to be low, the present application can prevent the inkjet process from becoming impossible due to the excessively high viscosity of the composition while improving the curing completion degree after curing of the sealing material, and can simultaneously provide moisture barrier properties and excellent curing sensitivity. In this specification, the weight average molecular weight means a value converted to standard polystyrene as measured by GPC (gel permeation chromatograph). In one example, a column consisting of a metal tube having a length of 250 to 300 mm and an inner diameter of 4.5 to 7.5 mm is filled with 3 to 20 mm polystyrene beads. When a solution diluted by dissolving a material to be measured in a THF solvent is passed through the column, the weight average molecular weight can be measured indirectly depending on the outflow time. The amount separated by size from the column can be detected by plotting it by time.

In one embodiment, the encapsulating composition according to the present invention may comprise a photoinitiator. The photoinitiator may be a photoradical initiator, and a specific type may be appropriately selected in consideration of a curing rate and the like. For example, a benzoin-based, hydroxy ketone-based, amino ketone-based or phosphine oxide-based photoinitiator, and the like may be used, and specifically, benzoin, benzoin methyl ether, benzoin ethyl ether, benzoin isopropyl ether, benzoin n-butyl ether, benzoin isobutyl ether, acetophenone, dimethylaminoacetophenone, 2,2-dimethoxy-2-phenylacetophenone, 2,2-diethoxy-2-phenylacetophenone, 2-hydroxy-2-methyl-1-phenylpropan-lone, 1-hydroxycyclohexyl phenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methyl) vinyl) phenyl] propanone] and 2,4,6-trimethylbenzoyl-diphenyl-phosphine oxide, and the like may be used, and the photoinitiator may be used alone or in combination of two or more.

In one example, the photoinitiator may be included in an amount of 0.01 to 10 wt % or less, specifically, 0.01 to 5 wt % or less based on the encapsulating composition. In view of the characteristics of the encapsulating composition of the present application applied directly on an organic electronic element, it is possible to minimize physical and chemical damage to the element by adjusting the content range of the photoinitiator.

In one embodiment, the encapsulating composition may comprise a surfactant. The surfactant is not limited thereto, but a silicone-based surfactant, a fluorine-based surfactant, or an acrylic surfactant is preferable.

A specific example of the silicone-based surfactant includes BYK-Chemie's BYK-077, BYK-085, BYK-300, BYK-301, BYK-302, BYK-306, BYK-307, BYK-310, BYK-320, BYK-322, BYK-323, BYK-325, BYK-330, BYK-331, BYK-333, BYK-335, BYK-341v344, BYK-345v346, BYK-348, BYK-354, BYK-355, BYK-356, BYK-358, BYK-361, BYK-370, BYK-371, BYK-375, BYK-380 or BYK-390, and the like, and a specific example of the fluorine-based surfactant includes DIC (DaiNippon Ink & Chemicals)'s F-114, F-177, F-410, F-411, F-450, F-493, F-494, F-443, F-444, F-445, F-446, F-470, F-471, F-472SF, F-474, F-475, F-477, F-478, F-479, F-480SF, F-482, F-483, F-484, F-486, F-487, F-172D, MCF-350SF, TF-1025SF, TF-1117SF, TF-1026SF, TF-1128, TF-1127, TF-1129, TF-1126, TF-1130, TF-1116SF, TF-1131, TF1132, TF1027SF, TF-1441 or TF-1442, and the like, without being limited thereto. In order to control the surface tension of the encapsulating composition according to the present invention, the surfactant added in the composition may be included in an amount of 0.1 to 1 wt % based on the encapsulating composition.

In addition to the above-described constitutions, the encapsulating composition according to the present application may comprise various additives within a range that does not affect the effects of invention as described above. For example, the encapsulating composition may comprise an antifoaming agent, a tackifier, a UV stabilizer or an antioxidant, and the like in an amount within an appropriate range according to desired physical properties.

In an embodiment of the present application, the encapsulating composition of the present application may be in a liquid phase at room temperature, for example, 25° C. In one embodiment, the encapsulating composition may be in a solventless type liquid phase. Here, the solventless type means containing a solvent in an amount of 0.05% or less. Also, in one embodiment, the encapsulating composition may be an ink composition. That is, the encapsulating composition according to the present application may be designed to have appropriate physical properties when discharged to a substrate using inkjet printing capable of non-contact patterning.

In one example, the encapsulating composition may have a viscosity as measured by Brookfield's DV-3 at a temperature of 25° C., a torque of 90% and a shear rate of 20 rpm in a range of 50 cP or less, 1 to 46 cP, 3 to 44 cP, 4 to 38 cP, 5 to 33 cP or 14 to 24 cP. The present application can implement physical properties capable of inkjetting at the time of application to an organic electronic element by controlling the viscosity of the composition in the above range, and can also provide a thin film encapsulating material by providing excellent coating properties.

As described in detail below, the encapsulating composition may form an organic layer by inducing crosslinking by irradiation with light. The irradiation with light may comprise irradiation with light having a wavelength range of about 250 to about 450 nm or about 300 to about 450 nm zone in a light quantity of 300 to 6,000 mJ/cm$^2$ or a light quantity of 500 to 4,000 mJ/cm$^2$.

At this time, as described below, the organic layer may have a thickness of 25 μm or less. In one example, the thickness may be 23 μm or less, 22 μm or less, 21 μm or less, or 20 μm or less, and the lower limit thereof may be 1 μm or more, or 2 μm or more. The present application can provide a thin organic electronic device by providing the organic layer to have a thin thickness.

In an embodiment of the present application, the cured product after curing the encapsulating composition may have a surface energy in a range of 10 to 50 mN/m, 12 to 45 mN/m, 15 to 40 mN/m, 18 to 35 mN/m or 20 mN/m to 30 mN/m. The measurement of the surface energy can be measured by a method known in the art, and for example, it can be measured by a method of Ring Method. As the present application satisfies the above surface energy range, the discharge from the inkjet head may be easy in the inkjet process.

As one example, the surface energy (γsurface, mN/m) can be calculated as γsurface=γdispersion+γpolar, and the surface energy can be measured using a drop shape analyzer (DSA100 product from KRUSS). For example, after an encapsulating composition for measuring the surface energy is applied on a SiNx substrate to a thickness of about 50 μm and a coating area of 4 cm$^2$ (width: 2 cm, height: 2 cm) to form a sealing film (spin coater), it is dried at room temperature for about 10 minutes or so under a nitrogen atmosphere and then UV-cured with an intensity of 1000 mW/cm$^2$ through a light quantity of 4000 mJ/cm$^2$. The process of dropping the deionized water whose surface tension is known on the film after curing, and obtaining the contact angle thereof is repeated five times to obtain an average value of the obtained five contact angle values, and identically, the process of dropping the diiodomethane whose surface tension is known thereon and obtaining the contact angle thereof is repeated five times to obtain an average value of the obtained five contact angle values. Then, the surface energy can be obtained by substituting the value (Strom value) regarding the solvent surface tension by the Owens-Wendt-Rabel-Kaelble method using the obtained average values of the contact angles for the deionized water and diiodomethane.

In an embodiment of the present application, after the encapsulating composition is cured into a thin film having a thickness of 20 μm, it may have a dielectric constant of 2.8 or less, 2.79 or less, 2.78 or less, 2.77 or less, 2.76 or less, 2.75 or less, 2.74 or less, 2.73 or less, 2.72 or less, 2.71 or less, 2.7 or less, 2.69 or less, or 2.68 or less under conditions of any one frequency of 110 to 250 kHz and a temperature of 25° C. or less. As one example, each dielectric constant may be measured at any one frequency of 150 to 250 kHz, and more specifically, may be measured at a frequency of 250 kHz.

As one example, after depositing aluminum on glass to be about 50 nm or so, and coating the encapsulating composition thereon by an inkjet printing method and UV-curing it with a light quantity of about 1,000 mJ/cm$^2$ to form an organic layer with a thickness of about 20 μm or so, the dielectric constant can be measured using an impedance/gain-phase measuring instrument HP 4194A for a specimen deposited with aluminum to about 50 nm or so on the organic layer.

The films mass-produced in the prior art have a dielectric constant in a range of about 3.4 or more to 4.5, which were unsuitable for use in large displays due to parasitic capacitance between electrodes. Also, in general, as the thickness decreases, it tends to exhibit a higher dielectric constant value, but the present application may have such a low dielectric constant value even in the thin thickness of 20 μm or less. In this way, the organic layer formed from the composition with the above constitutions satisfies the above dielectric constant range, whereby even if a thin organic layer is applied to an organic electronic device as described below, there is no inter-circuit interference problem, and thus it is possible to provide an organic electronic device capable of thinning. Since it is advantageous in improving the sensitivity of the touch sensor to lower the dielectric constant, the lower limit of the dielectric constant is not particularly limited, but it may be, as one example, 0.01 or 0.1.

In an embodiment of the present application, it may be 1.5 GPa or more, 1.7 GPa or more, 1.9 GPa or more, 2.1 GPa or more, 2.2 GPa or more, 2.3 GPa or more, 2.4 GPa or more, 2.5 GPa or more, 2.6 GPa or more, or 2.7 GPa or more at 25° C. after curing. As it satisfies such a modulus, the surface hardness is excellent, whereby it is possible to prevent damage to the organic layer, which is a cured product of the encapsulating composition, in a process such as CVD for forming an inorganic layer.

The modulus can be measured by forming an encapsulating composition into a film on a glass substrate to a predetermined thickness and curing it under UV conditions of 1000 $mW/cm^2$ through an LED UV lamp to prepare a specimen having both a width and a length of 20 cm and a thickness of 3 μm. In particular, for the cured specimen, it can be measured by loading the specimen for 5 seconds with a nano indenter HM-2000 (Fisher), holding it for 2 seconds, and then unloading it for 5 seconds again, and the measurement conditions may be conditions of Experimental mode: Indentation Mode (using Berkovitz), Control mode: Force control, Maximum force: 2 mN, 250 kHz, and 25° C.

In addition, in an embodiment of the present application, the encapsulating composition may have light transmittance of 90% or more, 92% or more, or 95% or more in the visible light region after curing. The present application provides an organic electronic device having high resolution, low power consumption and a long life-span by applying an encapsulating composition to a top emission organic electronic device within the above range. In addition, the encapsulating composition of the present application may have haze according to JIS K7105 standard test of 3% or less, 2% or less, or 1% or less after curing, where the lower limit is not particularly limited, but it may be 0%. Within the haze range, the encapsulating composition may have excellent optical properties after curing. In this specification, the light transmittance or haze as described above may be measured in a state of curing the encapsulating composition to the organic layer, which may be an optical characteristic measured when the thickness of the organic layer is any one thickness of 2 to 20 μm. In an embodiment of the present application, the moisture adsorbent or inorganic filler as described above may not be included, in order to implement the optical characteristics.

<Organic Electronic Devices>

The present application also relates to an organic electronic device. As shown in FIG. 1, an exemplary organic electronic device (3) may comprise a substrate (31): an organic electronic element (32) formed on the substrate (31); and an organic layer (33) sealing the top side of the organic electronic element (32) and formed by the above-described encapsulating composition.

In an embodiment of the present application, the organic electronic element (32) may comprise a first electrode layer, an organic material layer formed on the first electrode layer and containing at least a light emitting layer, and a second electrode layer formed on the organic material layer. The first electrode layer may be a transparent electrode layer or a reflective electrode layer, and the second electrode layer may also be a transparent electrode layer or a reflective electrode layer. More specifically, the organic electronic element (32) may comprise a reflective electrode layer formed on a substrate, an organic material layer formed on the reflective electrode layer and containing at least a light emitting layer, and a transparent electrode layer formed on the organic material layer.

In the present application, the organic electronic element (32) may be an organic light emitting diode.

In one example, the organic electronic device according to the present application may be a top emission type, but is not limited thereto, and may be applied to a bottom emission type.

The organic electronic device (3) protects the electrodes and the light emitting layer of the organic electronic element (32), which may further comprise an inorganic layer (35) between the organic electronic element (32) and the organic layer. The inorganic layer (35) may be a protective layer by chemical vapor deposition (CVD). As one example, the inorganic layer (34) may be one or more metal oxides or nitrides selected from the group consisting of Al, Zr, Ti, Hf, Ta, In, Sn, Zn and Si. The thickness of the inorganic layer may be 10 to 70 nm or about 20 to about 60 nm. In one example, the inorganic layer (34) of the present application may be an inorganic material without comprising a dopant or an inorganic material comprising a dopant. The dopant which may be doped may be one or more elements selected from the group consisting of Ga, Si, Ge, Al, Sn, Ge, B, In, Tl, Sc, V, Cr, Mn, Fe, Co and Ni, or an oxide of the element, but is not limited thereto.

As one example, the organic electronic device (3) may further comprise an inorganic layer (35) formed on the organic layer (33). The inorganic layer (34) may use the same or different material from the inorganic layer (35) formed between the organic electronic element (32) and the organic layer, and the inorganic layer (34) may be formed in the same manner as the inorganic layer (35).

Also, the organic layer may have a thickness of 25 μm or less. As one example, the thickness may be 23 μm or less, 22 μm or less, 21 μm or less, or 20 μm or less, and the lower limit thereof may be 1 μm or more, or 2 μm or more. The present application can provide a thin organic electronic device by providing the organic layer to have a thin thickness.

As one example, the organic electronic device (3) of the present application may comprise a encapsulation structure containing the organic layer (33) and the inorganic layer (34), as described above, where the encapsulation structure may comprise at least one or more organic layers (33) and at least one or more inorganic layers (34), and the organic layer (33) and the inorganic layer (34) may be repeatedly laminated. For example, the organic electronic device may have a structure of substrate/organic electronic element/inorganic layer/(organic layer/inorganic layer)n, where n may be a number in a range of 1 to 100. FIG. 1 is a cross-sectional view exemplarily showing a case where n is 1.

In one embodiment, it may comprise a encapsulation structure (36) including at least one or more organic layers and at least one or more inorganic layers, and a touch sensor (37) formed on the encapsulation structure.

In one embodiment, the touch sensor (37) may be formed directly on the encapsulation structure (36). That is, it may have a structure that the touch sensor (37) and the encapsulation structure (36) are in direct contact with each other, without interposing a separate layer such as a pressure-sensitive adhesive layer or an adhesive layer between the touch sensor (37) and the encapsulation structure (36). Such a laminated structure can be called a TOE (touch on encapsulation) structure. By having such a TOE structure, it is possible to reduce the thickness of the organic electronic device compared to the existing one.

Meanwhile, according to the thinning of the organic electronic device, the gap between the electrode (i.e., the conductive layer) for the touch panel and the electrode for the organic electronic element adjacent to the touch panel is narrowed, so that a parasitic current is generated between them, whereby there may be a problem in which the sensitivity of the touch sensor is lowered. Therefore, the TOE structure requires an organic layer for an encapsulating material having a low dielectric constant to prevent a decrease in touch sensitivity, so that the present application provides an encapsulating composition according to this necessity.

The touch sensor (37) means a device capable of recognizing input information obtained through contact with a user, which may be a sensor known in the related technical field. For example, the touch sensor may be: a capacitance type sensor for recognizing a touch based on static electricity generated in a user's body contact area (e.g., hand) and a current change resulting therefrom: or a pressure-sensitive type sensor for recognizing a touch based on a change in electrical capacitance that occurs while the conductive layers of the upper and lower plates of the touch sensor come into contact with the pressure applied by the user. The constitution of the sensor for recognizing a user's contact in each manner may be known in the related technical field.

In one example, the touch sensor (37) may comprise a conductive layer (not shown) on one or both sides. The material of the conductive layer is not particularly limited, where for example, a transparent conductive film such as ITO or a metal nanowire, and the like may be used. The conductive layer may have regions of channels through which electricity flows and non-channels through which electricity does not flow. These regions may be formed through a method such as etching or photolithography.

In one example, the organic electronic device (3) may further comprise a cover base material (not shown) on the uppermost surface. That is, the organic electronic device (3) according to the present invention may comprise the encapsulation structure (36), the touch sensor (37) and the cover base material sequentially. At this time, the cover base material and the touch sensor may be collectively referred to as the touch panel (37). As an encapsulating material is positioned on the touch panel, the TOE structure may be implemented.

The cover base material may have light-transmittance, for example, as in the case of the transmittance of 80% or more for visible light. In the case of having light-transmittance, the type of material included in the cover base material is not particularly limited. For example, the cover base material may comprise a polymer resin or a glass component. In one example, when it is necessary to impart flexible properties, the cover base material may comprise a polymer resin. It is not particularly limited, but for example, the cover base material may comprise, for example, a polyester film such as PC (polycarbonate), PEN (poly(ethylene naphthalate)) or PET (poly(ethylene terephthalate)): an acrylic film such as PMMA (poly(methylmethacrylate)), or a polyolefin film such as PE (polyethylene) or PP (polypropylene): a polyimide film: or a polyamide film, and the like.

<Method for Manufacturing Organic Electronic Device>

The present application also relates to a method for manufacturing an organic electronic device.

In one example, the manufacturing method may comprise a step of forming an organic layer (33) on a substrate (31), in which an organic electronic element (32) is formed thereon, so that the above-described encapsulating composition seals the top side of the organic electronic element (32).

Here, it may be produced by forming a reflective electrode or a transparent electrode on a substrate (31) such as glass or a polymer film, as the substrate (31) of the organic electronic element (32), by a method such as vacuum deposition or sputtering, and forming an organic material layer on the reflective electrode. The organic material layer may comprise a hole injecting layer, a hole transporting layer, a light emitting layer, an electron injecting layer, and/or an electron transporting layer. Subsequently, a second electrode is further formed on the organic material layer. The second electrode may be a transparent electrode or a reflective electrode.

The manufacturing method of the present application may further comprise a step of forming an inorganic layer (35) on the first electrode, the organic material layer and the second electrode, formed on the substrate (31). Then, the above-described organic layer (33) is applied to cover the top side of the organic electronic element (32) on the substrate (31). Here, the step of forming the organic layer (33) is not particularly limited and the above-described encapsulating composition may be applied to the top side of the substrate (31) using a process such as inkjet printing, gravure coating, spin coating, screen printing or reverse offset coating.

The manufacturing method may further comprise a step of irradiating the organic layer with light. In the present invention, a curing process may also be performed on an organic layer sealing an organic electronic device, and such a curing process may be performed, for example, in a heating chamber or a UV chamber, and preferably, may be performed in a UV chamber. In one example, the organic layer may be formed by applying the above-described encapsulating composition by an inkjet printing method, and inducing crosslinking of the applied encapsulating composition by irradiation with light, where the organic layer may be formed by irradiation with light in a wavelength range of 250 to 450 nm and a light quantity range of 300 to 6,000 $mJ/cm^2$, as described above.

The manufacturing method of the present application may further comprise a step of forming an inorganic layer (34) on the organic layer (33). In the step of forming an inorganic layer (34), a method known in the art may be used, which may be the same as or different from the above-described method of forming the inorganic layer ((35) in FIG. 1).

In addition, it may add a step of disposing a touch sensor (37) on the organic layer (33) or the inorganic layers (35, 34), that is, the encapsulation structure (36).

Advantageous Effects

As described above, the encapsulating composition according to examples of the present invention can improve touch sensitivity of an adjacent touch sensor and provide an excellent protective function against the external environment. However, the effects of the present invention are not limited to the above-mentioned effects, and other effects not mentioned will be clearly understood by those skilled in the art from the following description.

BRIEF DESCRIPTION OF DRAWINGS

FIG. 1 is a cross-sectional diagram illustrating an organic electronic device according to one example of the present invention.

Hereinafter, preferred examples of the present invention will be described in more detail with reference to the accompanying drawings. In describing the present invention, in order to facilitate the overall understanding, the same reference numerals are used for the same components in the drawing, and duplicate descriptions of the same components are omitted.

EXPERIMENTAL EXAMPLE

1. Composition Polarizability

The composition polarizability is the sum of values obtained by multiplying each "compound polarizability of radical-curable compounds" constituting the encapsulating composition and "parts by weight of the relevant radical-curable compound relative to 100 parts by weight of the encapsulating composition (that is, the weight ratio of the radical-curable compound to the encapsulating composition)", where the polarizability of the compound has been calculated by the following general equation 1.

That is, when the encapsulating composition is composed of a radical-curable compound (X), a radical-curable compound (Y) and a radical-curable compound (Z), the composition polarizability may be calculated by (polarizability of compound X*weight ratio of compound X to the encapsulating composition)+(polarizability of compound Y*weight ratio of compound Y to the encapsulating composition)+(polarizability of compound Z*weight ratio of compound Z to the encapsulating composition). Here, when calculating the weight ratio of the curable compound, it is calculated based on the total weight of all compositions included in the encapsulating composition, and it is calculated by including not only the radical-curable compound but also the photoinitiator or surfactant, and the like together.

Compound polarizability=(the value obtained by combining the number of carbons and the number of oxygens included in the molecular structure of the relevant radical-curable compound)/(the value obtained by subtracting the number of oxygens from the number of carbons in the molecular structure of the relevant radical-curable compound) [General Equation 1]

2. Curing Rate

The encapsulating compositions prepared according to Examples and Comparative Examples were each inkjet-coated on the cleaned bare glass, and cured at a light quantity of 1,000 mJ/$cm^2$ using an LED UV lamp in an $N_2$ atmosphere to form an organic layer with a thickness of 10 μm. Then, the peaks of the composition and the organic layer as the cured product were measured with Cary 5660 FT-IR (manufacturer Agilent) equipment, and the curing rate was measured through the integral value of the 1420 $cm^{-1}$ region.

Curing rate (%)=(1−organic layer integral value in 1420 $cm^{-1}$ region/composition integral value in 1420 $cm^{-1}$ region)×100

3. Dielectric Constant

An Al plate (conductive plate) was deposited to 150 nm on the cleaned bare glass. The encapsulating compositions prepared in Examples and Comparative Examples were each inkjet-coated on the deposited Al plate surface, and the coated composition was cured at a light quantity of 1000 mJ/$cm^2$ through an LED UV lamp to form an organic layer with a thickness of 10 μm. A specimen was prepared by depositing an Al plate (conductive plate) to 150 nm on the organic layer again. Thereafter, the dielectric constant of the prepared specimen was measured under conditions of 250 kHz and 25° C. using an impedance/gain-phase measuring instrument HP 4194A. In the present application, the dielectric constant may mean a relative value (ratio) with respect to the dielectric constant in the vacuum when the dielectric constant in the vacuum has been set to 1.

EXAMPLE

Examples 1 to 3

Compositions and contents (representing each part by weight based on 100 parts by weight of the composition) according to Table 1 below were prepared, and mixed at 25° C. for 3 hours or more to prepare the compositions according to Examples 1 to 3.

Comparative Examples 1 to 3

Compositions and contents (representing each part by weight based on 100 parts by weight of the composition) according to Table 1 below were prepared, and mixed at 25° C. for 3 hours or more to prepare the compositions according to Comparative Examples 1 to 3.

TABLE 1

| | Example | | | Comparative Example | | |
|---|---|---|---|---|---|---|
| | 1 | 2 | 3 | 1 | 2 | 3 |
| Polyfunctional aliphatic compound (Y2-A) | 17 | 17 | — | 40 | 20 | 17 |
| Polyfunctional aliphatic compound (Y2-B) | 20 | — | — | — | 51.5 | — |
| Polyfunctional aliphatic compound (Y2-C) | — | — | — | 56.5 | — | — |
| Monofunctional alicyclic compound (X1-A) | 22 | 42 | 40 | — | — | 42 |
| Monofunctional alicyclic compound (X1-B) | — | — | — | — | — | 17.5 |
| Polyfunctional alicyclic compound (X2) | 17.5 | 17.5 | 36.5 | — | 20 | — |
| Monofunctional aliphatic compound (Y1) | 20 | 20 | 20 | — | 5 | 20 |
| Potoinitiator (Darocure, TPO) | 3 | 3 | 3 | 3 | 3 | 3 |
| Surfactant (BYK-333) | 0.5 | 0.5 | 0.5 | 0.5 | 0.5 | 0.5 |

Y2-A: TMPTA (trimethylolpropane triacrylate, Miwon)

Y2-B: SR262 (1,12 dodecanediol dimethacrylate, Arkema)

Y2-C: CD595 (1,10-decanediol diacrylate, Arkema)

X1-A: Isobornylmethacrylate

X1-B: M1192 (Biphenylmethyl Acrylate, Miwon)

X2: Tricyclodecane dimethanol diacrylate (aldrich)

Y1: M180 (Stearyl acrylate, Miwon)

Table 2 below summarizes the experimental example data according to Examples and Comparative Examples above.

TABLE 2

| | Example | | | Comparative Example | | |
|---|---|---|---|---|---|---|
| | 1 | 2 | 3 | 1 | 2 | 3 |
| Composition polarizability | 1.52 | 1.47 | 1.3 | 1.88 | 1.7 | 1.5 |
| Curing rate (%) | 92 | 91 | 93 | 90 | 88 | 91 |
| Dielectric constant (250 kHz, 25° C.) | 2.75 | 2.72 | 2.68 | 3.2 | 2.95 | 2.95 |

Although described with reference to examples, it will be understood by those skilled in the art that the present invention may be variously modified and changed without departing from the spirit and scope of the present invention as set forth in the claims below.

EXPLANATION OF REFERENCE NUMERALS

3: organic electronic device
31: substrate
32: organic electronic element
36: encapsulation structure
35: inorganic layer
33: organic layer
34: inorganic layer
37: touch sensor

The invention claimed is:

1. An encapsulating composition comprising a radical-curable compound having at least one or more radical-curable functional groups, and having composition polarizability, wherein the radical-curable compound comprises a monofunctional alicyclic compound (X1), a polyfunctional alicyclic compound (X2), a monofunctional aliphatic compound (Y1) and a polyfunctional aliphatic compound (Y2), wherein based on 100 parts by weight of the monofunctional alicyclic compound (X1), the polyfunctional alicyclic compound (X2) is included in an amount of 20 to 95 parts by weight, the monofunctional aliphatic compound (Y1) is included in an amount of 20 to 95 parts by weight, and the polyfunctional aliphatic compound (Y2) is included in an amount of 30 to 200 parts by weight, wherein the composition polarizability is the sum of values, each of the values obtained by multiplying each "compound polarizability of the radical-curable compound" constituting the encapsulating composition and "a weight ratio of the corresponding radical-curable compound to the encapsulating composition," where the compound polarizability is calculated by the following General Equation 1, and the composition polarizability is 1.8 or less, and wherein the encapsulating composition has a dielectric constant of 2.8 or less at any one frequency of 110 to 250 kHz and a temperature of 25° C. after curing:

Compound polarizability=(value obtained by combining the number of carbons and the number of oxygens included in a molecular structure of the corresponding radical-curable compound)/(value obtained by subtracting the number of oxygens from the number of carbons included in the molecular structure of the corresponding radical-curable compound). [General Equation 1]

2. The encapsulating composition according to claim 1, wherein the monofunctional alicyclic compound (X1) is included in an amount of 10 to 60 wt %.

3. The encapsulating composition according to claim 1 wherein the polyfunctional alicyclic compound (X2) is included in an amount of 30 to 90 parts by weight relative to 100 parts by weight of the monofunctional alicyclic compound (X1).

4. The encapsulating composition according to claim 1, wherein the monofunctional aliphatic compound (Y1) comprises an aliphatic compound having an alkyl group with 12 to 24 carbon atoms.

5. The encapsulating composition according to claim 1, wherein the monofunctional aliphatic compound (Y1) is included in an amount of 30 to 90 parts by weight relative to 100 parts by weight of the monofunctional alicyclic compound (X1).

6. The encapsulating composition according to claim 1, wherein the polyfunctional aliphatic compound (Y2) is included in an amount of 35 to 180 parts by weight relative to 100 parts by weight of the monofunctional alicyclic compound (X1).

7. The encapsulating composition according to claim 1, further comprising a photoinitiator.

8. The encapsulating composition according to claim 1, further comprising a surfactant.

9. The encapsulating composition according to claim 1, which is a solventless type ink composition.

10. An organic electronic device comprising: a substrate; an organic electronic element formed on the substrate; and an organic layer sealing the whole face of the organic electronic element and formed by the encapsulating composition according to claim 1.

11. The organic electronic device according to claim 10, comprising an inorganic layer formed between the organic electronic element and the organic layer or on the organic layer.

12. A method for manufacturing an organic electronic device, comprising a step of forming an organic layer on a substrate, in which an organic electronic element is formed thereon, so that the encapsulating composition according to claim 1 seals the whole face of the organic electronic element.

* * * * *